United States Patent
Tao et al.

(10) Patent No.: US 7,732,118 B2
(45) Date of Patent: Jun. 8, 2010

(54) NEGATIVE-WORKING IMAGEABLE ELEMENTS AND METHODS OF USE

(75) Inventors: Ting Tao, Fort Collins, CO (US); Shashikant Saraiya, Fort Collins, CO (US); Eric Clark, Loveland, CO (US); Frederic E. Mikell, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/746,816

(22) Filed: May 10, 2007

(65) Prior Publication Data
US 2008/0280229 A1  Nov. 13, 2008

(51) Int. Cl.
G03C 1/00 (2006.01)
G03F 7/26 (2006.01)

(52) U.S. Cl. ............... 430/270.1; 430/281.1; 430/302; 430/434; 101/454

(58) Field of Classification Search ............. 430/281.1, 430/905, 907, 909, 910, 302, 270.1
See application file for complete search history.

(56) References Cited

U.S. PATENT DOCUMENTS

| | | | | |
|---|---|---|---|---|
| 4,247,624 A * | 1/1981 | Foss | | 430/281.1 |
| 4,286,043 A * | 8/1981 | Taylor, Jr. | | 430/253 |
| 4,654,294 A * | 3/1987 | Sato et al. | | 430/281.1 |
| 4,940,646 A * | 7/1990 | Pawlowski | | 430/175 |
| 6,066,435 A * | 5/2000 | Munk | | 430/284.1 |
| 6,214,521 B1 * | 4/2001 | Telser et al. | | 430/281.1 |
| 6,248,498 B1 * | 6/2001 | Gybin | | 430/176 |
| 6,569,603 B2 | 5/2003 | Furukawa | | |
| 6,702,437 B2 | 3/2004 | Fujimaki et al. | | |
| 6,727,044 B1 | 4/2004 | Fujimaki et al. | | |
| 6,747,088 B1 | 6/2004 | Schwalm et al. | | |
| 6,858,373 B2 | 2/2005 | Kunita | | |
| 6,916,595 B2 | 7/2005 | Fujimaki et al. | | |
| 7,033,733 B2 * | 4/2006 | Hsu | | 430/281.1 |
| 7,153,632 B1 * | 12/2006 | Saraiya et al. | | 430/284.1 |
| 7,261,998 B2 * | 8/2007 | Hayashi et al. | | 430/271.1 |
| 7,314,699 B2 * | 1/2008 | Gries | | 430/270.1 |
| 2001/0007736 A1 * | 7/2001 | Takasaki et al. | | 430/281.1 |
| 2004/0043325 A1 | 3/2004 | Shibuya et al. | | |
| 2004/0131972 A1 | 7/2004 | Fujimaki | | |
| 2005/0031986 A1 | 2/2005 | Kakino et al. | | |
| 2006/0068328 A1 | 3/2006 | Arimura et al. | | |
| 2006/0199097 A1 | 9/2006 | Oda et al. | | |
| 2006/0269874 A1 * | 11/2006 | Huang et al. | | 430/302 |

FOREIGN PATENT DOCUMENTS

| | | |
|---|---|---|
| EP | 1 757 981 | 2/2007 |
| JP | 2000-187322 | 7/2000 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

A radiation-sensitive composition includes a radically polymerizable component, initiator composition, a radiation absorbing compound, and a polymeric binder having recurring units that are derived from various ethylenically unsaturated polymerizable monomers provided that at least 40 mol % of the recurring units have a tertiary carbon atom in the backbone and the rest of the recurring units have a secondary or quaternary carbon atom in the backbone. This composition can be used to provide negative-working imageable elements that can be imaged and developed to provide lithographic printing plates that have desired imaging speed and excellent run length without the need for a post-exposure backing step.

10 Claims, 1 Drawing Sheet

NEGATIVE-WORKING IMAGEABLE ELEMENTS AND METHODS OF USE

FIELD OF THE INVENTION

This invention relates to radiation-sensitive compositions and imageable elements such as negative-working lithographic printing plate precursors. These imageable elements also can be developed either on-press or off-press. The invention also relates to methods of using these imageable elements.

BACKGROUND OF THE INVENTION

Radiation-sensitive compositions are routinely used in the preparation of imageable materials including lithographic printing plate precursors. Such compositions generally include a radically polymerizable component, radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation compositions and imageable elements containing reactive polymer binders are described in U.S. Pat. No. 6,569,603 (Furukawa) and EP 1,182,033A1 (Fujimaki et al.). The reactive polymer binders include reactive vinyl groups that are pendant to the polymer backbone. Other IR-sensitive compositions are described in U.S. Pat. No. 6,309,792 (Hauck et al.), U.S. Pat. No. 6,893,797 (Munnelly et al.), U.S. Pat. No. 6,787,281 (Tao et al.), and U.S. Pat. No. 6,899,994 (Huang et al.), U.S. Patent Application Publication 2003/0118939 (West et al.), and EP 1,079,276A1 (Lifka et al.) and EP 1,449,650A1 (Goto).

Various negative-working imageable elements containing urethane polymers or polymers with ethylenically unsaturated side chains are described for example in U.S. Pat. No. 6,916,595 (Fujimaki et al.), U.S. Pat. No. 6,702,437 (Fujimaki et al.), and U.S. Pat. No. 6,727,044 (Fujimaki et al.), Japanese Kokai 2000-187322 (Mitsubishi Chemical Co.), and U.S. Patent Application Publications 2004/0131972 (Fujimaki et al.), 2005/0031986 (Kakino et al.), 2006/0068328 (Aimura et al), 2006/199097 (Oda et al.).

Other imaging compositions and elements are described in U.S. Pat. No. 6,858,373 (Kunita) and U.S. Patent Application Publication 2004/0043325 (Shibuya et al.).

Problem to Be Solved

The various radiation sensitive compositions of the art can readily be used to prepare negative-working imageable elements but they generally require the use of a post-exposure baking step ("pre-heat" step) to enhance good adhesion and run length. Omitting the post-exposure baking step can result in complete image failure following development with alkaline developers or during on-press development. During long print runs, they may show a loss of highlight dots long before solid image areas show signs of wear or degradation.

It would be desirable in the industry to have highly sensitive negative-working imageable compositions and elements that provide good run length but that can also be prepared for use without a post-exposure baking step.

SUMMARY OF THE INVENTION

The present invention provides a radiation-sensitive composition comprising:

a radically polymerizable component, an initiator composition capable of generating free radicals sufficient to initiate polymerization of free radically polymerizable groups upon exposure to imaging radiation, a radiation absorbing compound, and a polymeric binder that has an all carbon backbone wherein at least 40 mol % of the carbon atoms forming the all carbon backbone are tertiary carbon atoms to which are attached the same or different pendant groups with the exception of pendant groups having ethylenically unsaturated free radically reactive groups.

This invention also provides an imageable element comprising a substrate having thereon an imageable layer comprising the radiation-sensitive composition described above.

Further, a method of this invention for making a printing plate comprises:

A) imagewise exposing the imageable element of the present invention using imaging radiation to produce exposed and non-exposed regions, and B) with or without a post-exposure baking step, developing the imagewise exposed element to remove only the non-exposed regions, and C) optionally heating or floodwise UV-exposing the developed element.

The radiation-sensitive compositions and imageable elements of this invention provide imaged elements (for example, lithographic printing plates) with improved run length without the need for a post-exposure baking step. In addition, we found that our radiation-sensitive compositions retain desirable imaging sensitivity (speed). We have achieved these advantages without using polymeric binders having pendant groups with carbon-carbon unsaturated groups as taught in the art.

These advantages are achieved with our radiation-sensitive compositions that include a particular polymeric binder whose predominant recurring units (at least 85 mol %) have a tertiary carbon atom in the backbone while the rest of the recurring units have a quaternary carbon atom.

DETAILED DESCRIPTION OF THE INVENTION

Definitions

Figure 1:
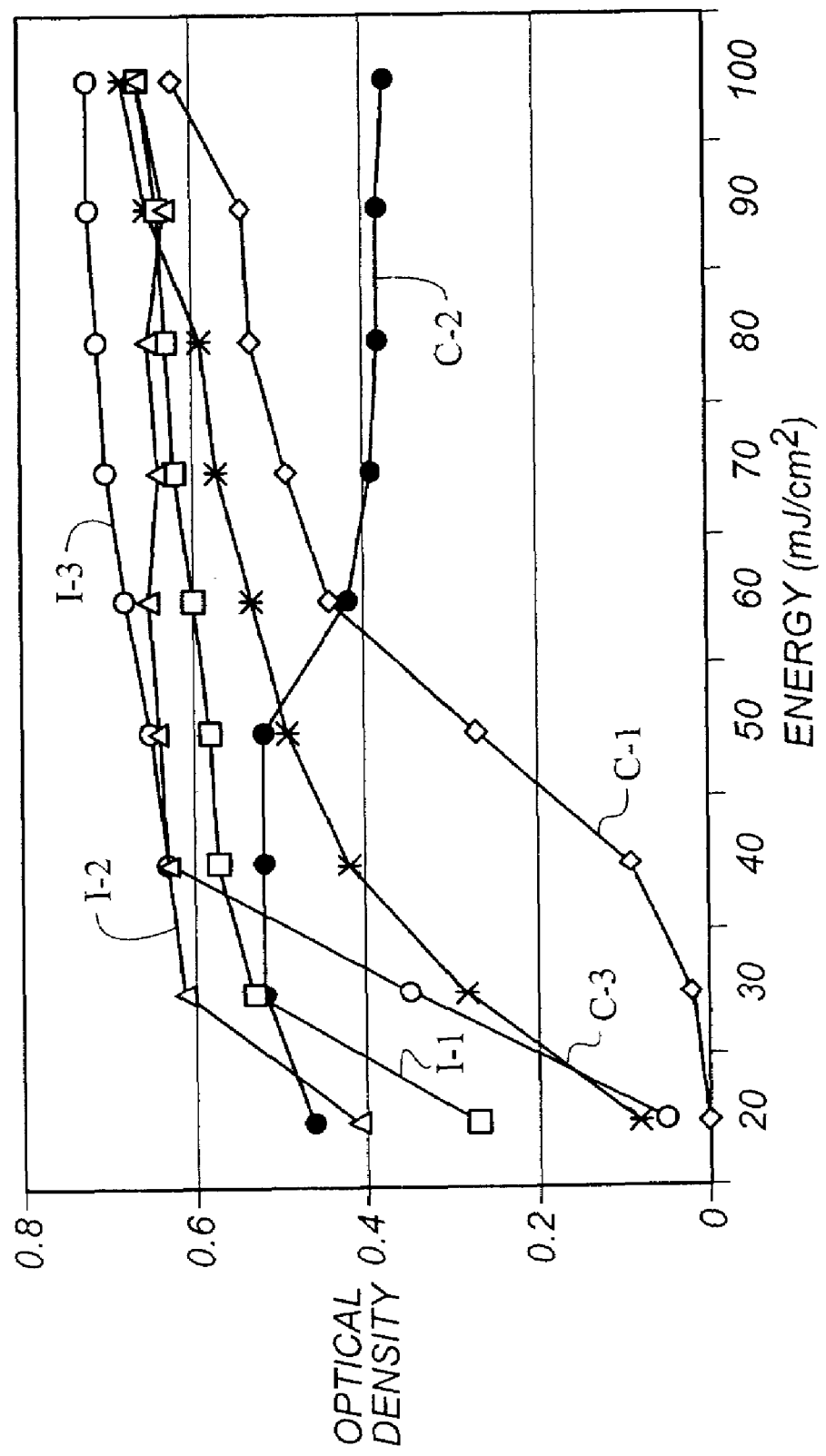
FIG. 1 contains graphical plots of the optical density of imaged areas as a function of exposure energy (mJ/cm$^2$) for the printing plates obtained in the Examples below.

Unless the context indicates otherwise, when used herein, the terms "radiation-sensitive composition", "imageable element", "lithographic printing plate precursor", and "printing plate precursor" are meant to be references to embodiments of the present invention.

In addition, unless the context indicates otherwise, the various components described herein such as "primary polymeric binder", "initiator", "co-initiator", "free radically polymerizable component", "radiation absorbing compound", "secondary polymeric binder", "nonionic phosphate acrylate", and similar terms also refer to mixtures of such components. Thus, the use of the articles "a", "an", and "the" is not necessarily meant to refer to only a single component.

The term "single-layer imageable element" refers to an imageable element having only one imageable layer that is essential to imaging, but as pointed out in more detail below, such elements may also include one or more layers under or over (such as a topcoat) the imageable layer to provide various properties.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-sensitive Compositions

The radiation-sensitive compositions may have any utility wherever there is a need for a coating that is polymerizable using suitable radiation, and particularly where it is desired to remove unexposed regions of the coated and irradiated or exposed composition. The radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below, as well as in paint compositions, coating finishes, and molding compositions.

The radiation-sensitive composition includes a free radically polymerizable component that contains one or more free radically polymerizable groups (that is, a carbon-carbon double bond) that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.).

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau). The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.).

The free radically polymerizable component can be present in the radiation-sensitive composition at a weight ratio to the primary polymeric binder (described below) of from about 5:95 to about 95:5, from about 10:90 to about 90:10, or from about 30:70 to about 70:30. For example, the free radically polymerizable component can be present in an amount of at least 10 and up to and including 70% (typically from about 20 to about 50%) based on the total solids in the radiation sensitive composition, or the total dry weight of the imageable layer.

The radiation-sensitive composition also includes an initiator composition that is capable of generating free radicals sufficient to initiate polymerization of all the various free radically polymerizable components upon exposure of the composition to imaging radiation. The initiator composition is generally responsive to electromagnetic imaging radiation in the ultraviolet, visible, infrared, or near infrared spectral regions, corresponding to the spectral range of at least 150 nm and up to and including 1500 nm. More typically, they are responsive to either UV (or "violet") radiation at a wavelength of from about 150 to about 475 nm or to infrared radiation of at least 700 nm and up to and including 1400 nm. Initiator compositions are used that are appropriate for the desired imaging wavelength(s).

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S. Patent Application Publication 2003/0064318 (noted above).

Co-initiators can also be used, such as metallocenes (such as titanocenes and ferrocenes), polycarboxylic acids, haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

Useful IR-sensitive radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are useful such as the iodonium salts. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in the noted U.S. Pat. No. 6,569,603 that is paired with a suitable cation such as an alkali metal ion, an onium, or a cationic sensitizing dye. Useful onium cations for this purpose include but are not limited to, ammonium, sulfonium, phosphonium, iodonium, and diazonium cations. Iodonium salts such as iodonium borates are useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Other useful initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Useful azine compounds are triazine compounds that include a 6-membered ring containing 3 carbon atoms and 3 nitrogen atoms such as those described in U.S. Pat. No. 6,309,792 (Hauck et al.), U.S. Pat. No. 6,010,824 (Komano et al.), U.S. Pat. No. 5,885,746 (Iwai et al), U.S. Pat. No. 5,496,903 (Watanabe et al.), and U.S. Pat. No. 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are useful in the initiator composition. Representative compounds of this type include but are not limited to, 1,3,5-triazine derivatives such as those having 1 to 3 -$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxynaphtho-1yl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri(tribromomethyl)-2-triazine.

The azine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

Thus, several initiator/co-initiator combinations can be used in various embodiments of the present invention, including but not limited to:

a) a triazine as described above in combination with a co-initiator that is an N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof) as described above, b) a boron-containing counterion that comprises four of the same or different alkyl or aryl groups, or any combination thereof, wherein the boron-containing counterion is a counterion for an infrared radiation absorbing dye, or is a counterion in an onium salt, c) a triazine as described above in combination with a co-initiator that is a mercaptan derivative as described above, d) an iodonium salt (such as an iodonium borate) as described above in combination with a co-initiator that is a metallocene (for example a titanocene or ferrocene) as described for example in U.S. Pat. No. 6,936,384 (noted above), e) an iodonium salt (such as an iodonium borate) as described above in combination with a co-initiator that is a mercaptotriazole as described above, and f) a triazine as described above in combination with an alkyl triarylborate or a tetraarylborate.

Still other useful initiator compositions include one or more diaryliodonium borate compounds, each of which is represented by the following Structure (IB):

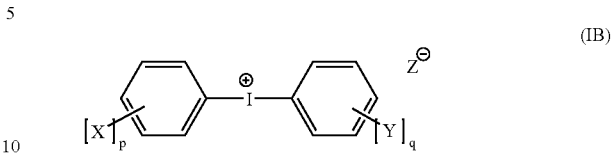

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure I, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

Z⁻ is an organic anion represented by the following Structure (IB$_Z$):

(IBz)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. Z⁻ can be a tetraphenyl borate wherein the phenyl groups are substituted or unsubstituted (for example, all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference.

Examples of still other useful initiator compositions are described for example in EP 1,182,033 (Fujimaki et al.) and in U.S. Pat. No. 6,352,812 (Shimazu et al.) and U.S. Pat. No. 6,893,797 (Munnelly et al.).

The free radical generating compounds in the initiator composition are generally present in the radiation-sensitive composition (and imageable layer) in an amount of at least 0.5% and up to and including 30%, and typically at least 2 and up to and including about 20%, based on composition total solids or total dry weight of the imageable layer. The optimum amount of the various initiator components may differ for various compounds and the sensitivity of the radiation-sensitive composition that is desired and would be readily apparent to one skilled in the art.

The polymeric binders that provide the advantages of this invention are called "primary" polymeric binders and have all carbon backbones wherein at least 40 and up to 100 mol % (and typically from about 40 to about 50 mol %) of the carbon atoms forming the all carbon backbones are tertiary carbon atoms. The remaining carbon atoms in the all carbon backbone are non-tertiary carbon atoms.

By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms.

One way to represent a tertiary carbon atom in the all carbon backbone is with the following Structure (T-CARBON):

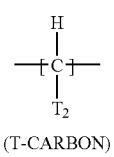

(T-CARBON)

wherein $T_2$ is a group other than hydrogen provided that $T_2$ does not include an ethylenically unsaturated free radically reactive group (such as a —C═C— group). In many embodiments, $T_2$ is a pendant group selected from N-carbazole, aryl (defined similarly as for Ar below), halo, cyano, —C(═O)R, —C(═O)Ar, —C(═O)OR, —C(═O)OAr, —C(═O)NHR, and —C(═O)NHAr pendant groups, wherein R is hydrogen or an alkyl, cycloalkyl, halo, alkoxy, acyl, or acyloxy group, and Ar is an aryl group other than a styryl group.

For example, when R is an alkyl or alkoxy group, it can be linear or branched and comprise 1 to 8 carbon atoms. Useful cycloalkyl groups for R can have 5 to 7 carbon atoms in the ring structure that are fully saturated or partially saturated but not aromatic in nature. Useful acyl and acyloxy groups can be linear or branched and have 2 to 8 carbon atoms. Useful halo groups include fluoro, chloro, bromo, and iodo groups. All of the R groups (except halo) can be further substituted with various substituents that a skilled worker would readily perceive as useful and not harmful to the use of the polymeric binder in the radiation-sensitive composition.

Ar is a 6-, 10-, or 14-membered carbocyclic aromatic ring system (such as phenyl, anthryl, and naphthyl) that can be also substituted as described for R. Ar is not a styryl group or other aromatic group having an ethylenically unsaturated free radically reactive substituent.

The tertiary carbons represented by Structure (T-CARBON) can exist randomly along the all carbon backbone, or they can exist in regular patterns such as in a regular alternation with non-tertiary carbon atoms, or in blocks of tertiary carbon atoms alternating with blocks of non-tertiary carbon atoms.

The quaternary carbon atoms present in the all carbon backbone of the polymeric binder can also have the same or different pendant groups filling two of the valences. For example, one or both valences can be filled with the same or different alkyl groups as defined above for R, or one valence can be filled with an alkyl group and another valence can be filled with a N-carbazole, aryl other than a styryl group, halo, cyano, —C(=O)R, —C(=O)Ar, —C(=O)OR, —C(=O)OAr, —C(=O)NHR, or —C(=O)NHAr pendant group, wherein R and Ar are as defined above. The pendant groups attached to the tertiary and quaternary carbons in the all carbon backbone can be the same or different and typically, they are different. It should also be understood that the pendant groups attached to the various tertiary carbon atoms can be the same throughout the polymeric molecule, or they can be different. For example, the tertiary carbon atoms can be derived from the same or different ethylenically unsaturated polymerizable monomers. Moreover, the quaternary carbon atoms throughout the polymeric molecule can have the same or different pendant groups.

It should also be understood that while most embodiments of the polymeric binders are derived from one or more ethylenically unsaturated polymerizable monomers that provide recurring units with two carbon atoms each, other polymeric binders can also include recurring units comprising 2, 3, or 4 carbon atoms in the all carbon backbone.

In some embodiments of this invention, the polymeric binder can be represented by the following Structure (I):

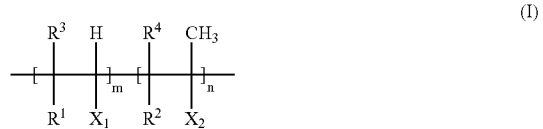

wherein m is at least 85 mol % and the sum of m and n is 100 mol %. In some embodiments, m is at least 89 mol %, and in other embodiments, m is from about 85 to 100 mol %.

In Structure (I), $R^1$ through $R^4$ are independently hydrogen or alkyl, cycloalkyl, aryl (other than styryl), halo, alkoxy, acyl, or acyloxy groups as defined above, and $X_1$ and $X_2$ are independently N-carbazole, aryl (other than styryl), halo, cyano, —C(=O)R, —C(=O)Ar, —C(=O)OR, —C(=O)OAr —C(=O)NHR, or —C(=O)NHAr groups wherein R and Ar is as defined above. Alternatively, $R^1$ and $X_1$ together or $R^2$ and $X_2$ together can form a substituted or unsubstituted carbocyclic or heterocyclic ring. When either $R^2$ or $R^4$ is hydrogen, both are then hydrogen.

For example, $R^1$ through $R^4$ can be independently hydrogen, methyl, or halo groups, and more likely, each is hydrogen. In addition, $X_1$ can be one or more of acetyl, phenyl (other than a styryl group), N-carbazole, cyano, carboxy ester, or carboxy amide pendant groups, and $X_2$ can be one or more carboxy ester or carboxy amide pendant groups.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

Useful primary polymeric binders have a molecular weight of from about 2,000 to about 1,000,000, an acid value of from about 20 to about 400 mg KOH/g, or both.

In addition, each primary polymeric binder may have a glass transition temperature ($T_g$) of at least 50° C. and typically at least 80° C. and up to 250° C., as determined by Differential Scanning Colorimetry (DSC).

The primary polymeric binder can comprise at least 10 and up to 80 weight % (typically from about 15 to about 40 weight %), based on the total dry weight of the radiation-sensitive composition (or imageable layer). In addition, one or more primary polymeric binders can comprise at least 20 and up to 100 weight %, or from about 50 to 100 weight %, of the total amount of polymeric binders in the radiation-sensitive composition or imageable layer.

The primary polymeric binders can be obtained by addition polymerization of the desired ethylenically unsaturated polymerizable monomers in the desired proportions using conventional reaction conditions, polymerization initiators, and solvents. Representative synthetic methods are described below before the Examples.

If desired, a variety of "secondary" polymeric binders can be used with the primary polymeric binders in the radiation-sensitive composition, including those known in the art for use in negative-working radiation-sensitive compositions. These secondary polymeric binders generally have a molecular weight of at least 2,000 and up to and including 1,000,000, at least 10,000 and up to and including 200,000, or at least 10,000 and up to and including 100,000. The acid value (mg KOH/g) of the polymeric binder is generally from about 0 and up to and including 400, at least 0 and up to and including 200, or at least 0 and up to and including 130, as determined using known methods. If present, they are used up to 50 weight % of the total weight of polymeric binders in the radiation-sensitive composition and imageable layer.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182, 033 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.). Also useful are the vinyl carbazole polymers described in copending and commonly assigned U.S. Ser. No. 11/356,518 (filed Feb. 17, 2006 by Tao et al.), and the polymers having pendant vinyl groups as described in copending and commonly assigned U.S. Ser. No. 11/349,376 (filed Feb. 7, 2006 by Tao et al.), both incorporated herein by reference. Copolymers of polyethylene glycol methacrylate/acrylonitrile/styrene in particulate form, dissolved copolymers of carboxyphenyl methacrylamide/-acrylonitrile/methacrylamide/N-phenyl maleimide, copolymers of poly ethylene glycol methacrylate/acrylonitrile/vinylcarbazole/styrene/methylacrylic acid, N-phenyl maleimide/methacrylamide/methacrylic acid, urethane-acrylic intermediate A (the reaction product of p-toluene sulfonyl isocyanate and hydroxylethyl methacrylate)/acrylonitrile/N-phenyl maleimide, and N-methoxymethyl methacrylamide/methacrylic acid/acrylonitrile/n-phenylmaleimide are also useful.

Other useful secondary polymeric binders in the radiation-sensitive composition (and imageable elements described below) designed for on-press development are those having poly(alkylene glycol) side chains directly or indirectly linked to the polymeric backbone.

Many of such polymeric binders are dispersible, developable, or soluble in water or water/solvent mixtures such as fountain solutions or mixtures of fountain solutions and lithographic printing inks. Such polymeric binders include polymeric emulsions, dispersions, or polymers having the pendant poly(alkylene glycol) side chains that can render the imageable elements as "on-press" developable. Such polymeric binders are described for example in U.S. Pat. Nos. 6,582,882 and 6,899,994 (both noted above) and U.S. Patent Application Publication 2005/0003285 (Hayashi et al.). In some instances, these polymeric binders are present in the imageable layer at least partially and possibly entirely, as discrete particles.

Other useful secondary polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene glycol) side chains.

These polymeric binders comprise poly(alkylene glycol) and cyano side chains. These polymers can be graft copolymers having a main chain polymer and poly(alkylene glycol) pendant side chains. Other polymers are block copolymers having blocks or segments of (alkylene glycol)-containing recurring units and non(alkylene glycol)-containing recurring units. Both graft and block copolymers can additionally have pendant cyano groups attached directly to the hydrophobic backbone. The alkylene glycol side chains generally comprise at least 10 constitutional alkylene glycol units and up to and including 150 of such units, at least 10 and up to and including 100 of such units, at least 10 and up to and including 50 of such alkylene glycol units, or at least 15 and up to and including 50 of such alkylene glycol units. The constitutional alkylene glycol units can be the same or different in an individual side chain and are generally $C_1$ to $C_6$ alkylene glycol groups, and more typically $C_1$ to $C_3$ alkylene glycol groups. The alkylene portions can be linear or branched or substituted versions thereof. Poly(ethylene glycol) and poly(propylene glycol) side chains are useful.

As noted above, in some embodiments, the secondary polymeric binders comprise recurring units comprising the poly(alkylene glycol) side chains as well as recurring units having pendant cyano groups attached directly to the hydrophobic backbone. By way of example only, such recurring units can comprise pendant groups comprising cyano, cyano-substituted, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (noted above).

By way of example, secondary polymeric binders that are useful in the IR-sensitive compositions and imageable elements can be formed by polymerization of a combination or mixture of suitable ethylenically unsaturated polymerizable monomers or macromers, such as:

A) acrylonitrile, methacrylonitrile, or a combination thereof,

B) poly(alkylene glycol) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, vinyl carbazole, methacrylate esters, acrylamide, N-phenyl maleimide, carboxyphenyl methacrylamide, allyl methacrylate, carboxyphenyl maleimide, 2-acrylamido-2-methyl-1-propane sulfonic acid, methacrylamide, or a combination of such monomers.

The amount of the poly(alkylene glycol) side chains in such polymeric binders is at least 0.5 and up to and including 60 weight %, at least 2 and up to and including 50 weight %, at least 5 and up to and including 40 weight %, or at least 5 and up to and including 20 weight %, based on the total polymeric binder weight. The amount of poly(alkylene glycol) segments in block copolymers is generally at least 5 and up to and including 60 weight %, at least 10 and up to and including 50 weight %, or at least 10 and up to and including 30 weight %.

Where the polymeric binders comprise pendant cyano groups, the amount of such cyano groups is at least 5 and up to and including 99.5 weight %, at least 10 and up to and including 80 weight %, or at least 25 and up to and including 60 weight %, based on the total polymeric binder weight.

In some embodiments, it may be useful to include an acrylic-urethane hybrid polymer that is commercially available in dispersions from Air Products and Chemicals, Inc. (Allentown, Pa.) under the tradename Hybridur®, for example, the Hybridur® 540, 560, 570, 580, 870, and 878 acrylic-urethane hybrid dispersions. Still other secondary polymeric binders are water-insoluble but soluble in conventional alkaline developers. Examples of such polymeric binders include but are not limited to, (meth)acrylic acid and acid ester resins [such as (meth)acrylates], polyvinyl acetals, phenolic resin, polymers derived from styrene, N-substituted cyclic imides or maleic anhydrides, such as those described in EP 1,182,033 (noted above) and U.S. Pat. No. 6,309,792 (noted above), U.S. Pat. No. 6,352,812 (Shimazu et al.), U.S. Pat. No. 6,569,603 (noted above), and U.S. Pat. No. 6,893,797 (noted above). Also useful are the vinyl carbazole polymers described in copending and commonly assigned U.S. Ser. No. 11/356,518 (filed Feb. 17, 2006 by Tao et al.) and the polymers having pendant vinyl groups as described in copending and commonly assigned 11/349,376 (filed Feb. 7, 2006 by Tao et al.), both of which are incorporated herein by reference.

The radiation-sensitive composition generally includes one or more radiation absorbing compounds, or sensitizers, that absorb imaging radiation, or sensitize the composition to imaging radiation having a $\lambda_{max}$ of from the UV to the IR region of the electromagnetic spectrum, that is, at least 150 nm and up to and including 1400 nm. Some sensitizers can be used at any wavelength, but most sensitizers are optimally useful within certain wavelength ranges. For example, some sensitizers are optimal for use at an exposing wavelength of at least 150 nm and up to and including 650 nm (UV to visible). Other sensitizers are particularly optimal for use for exposure to UV radiation of at least 150 nm and up to and including 475 nm, while still others are optimal for use at an exposure wavelength of at least 650 nm and up to and including 1500 nm (near IR and IR).

In some embodiments, the radiation-sensitive composition contains a UV sensitizer where the free-radical generating compound is UV radiation sensitive (that is at least 150 nm and up to and including 475 nm), thereby facilitating photopolymerization. Typical UV radiation-sensitive free-radical generating compounds are described above. In some other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some useful sensitizers are described for example, in U.S. Pat. No. 6,908,726 (Korionoff et al.), WO 2004/074929 (Baumann et al.), and U.S. Patent Application Publications 2006/0063101 and 2006/0234155 (both Baumann et al.).

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above) that is incorporated herein by reference. Other useful visible and UV-sensitive sensitizing compositions include a cyanine dye and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan, oxazole, or oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$, through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet/visible radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, ozazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

In embodiments of this invention that are sensitive to infrared radiation, the radiation-sensitive compositions can comprise an infrared radiation absorbing compound ("IR absorbing compounds") that absorbs radiation of at least 700 nm and up to and including 1500 nm and typically of at least 700 nm and up to and including about 1200 nm. For imageable elements designed for on-press development, it is particularly useful for such IR absorbing compounds to be used in combination with onium salts to enhance polymerization of the polymerizable component and to produce a more durable printing plate.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), and 6,787,281 (Tao et al.), and EP 1,182, 033A2 (noted above).

A general description of one class of suitable cyanine dyes is shown by the formula in paragraph [0026] of WO 2004/ 101280 (Munnelly et al.), incorporated herein by reference, and a useful IR absorbing compounds is identified below with the Examples.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Useful IR dyes include but are not limited to, the following compounds:

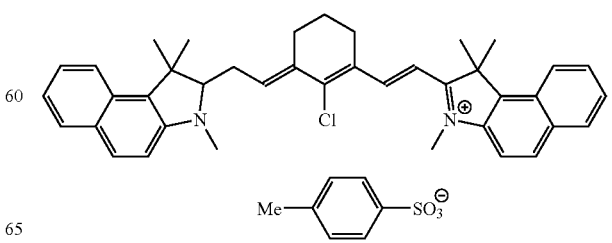

Same as above but with $C_3F_7CO_2^-$ as the anion.
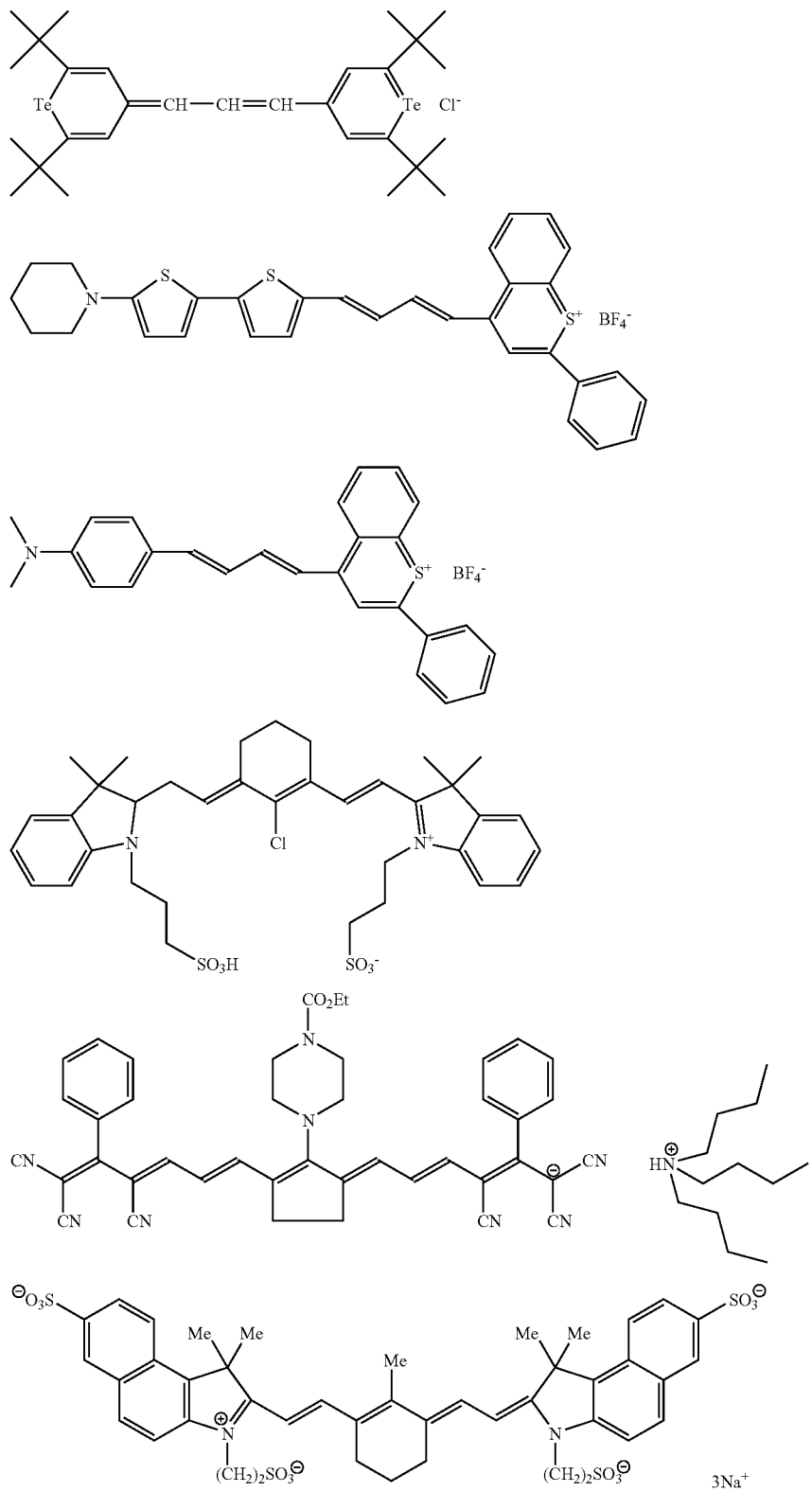

-continued
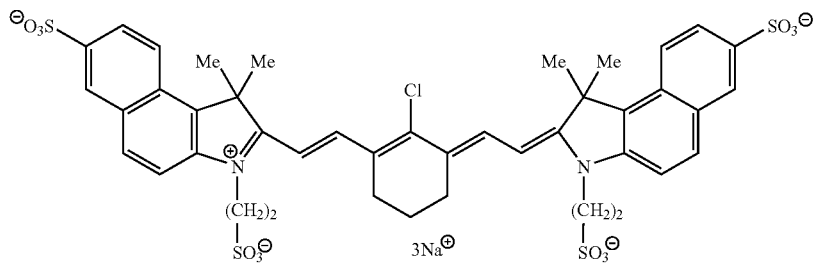
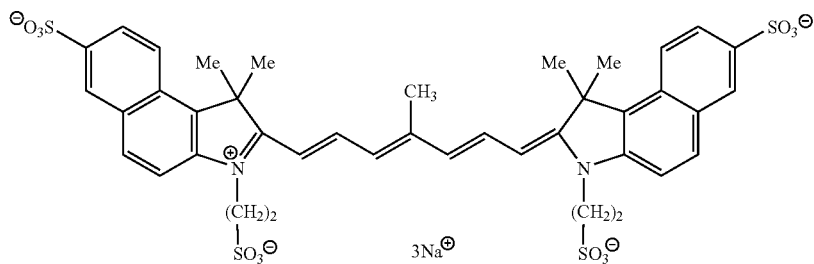
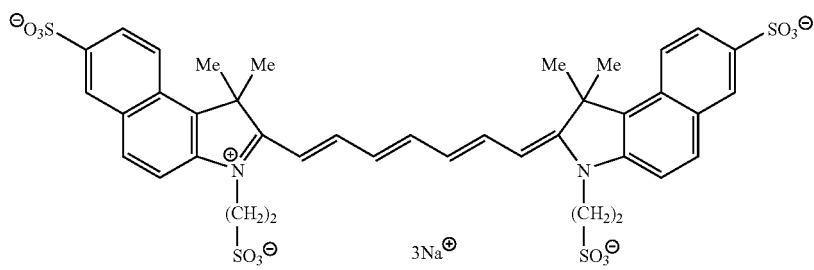
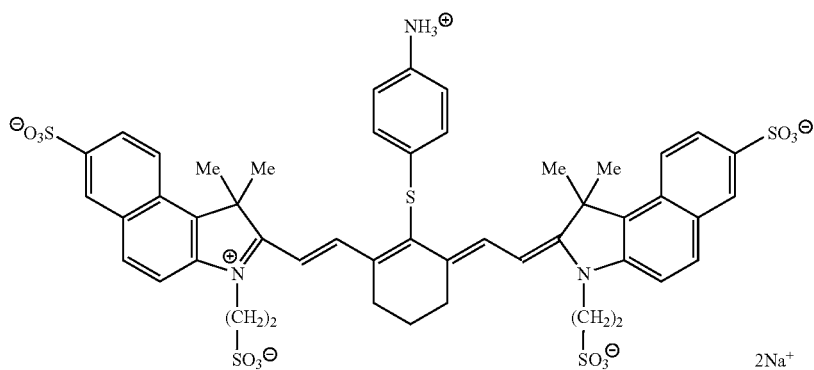
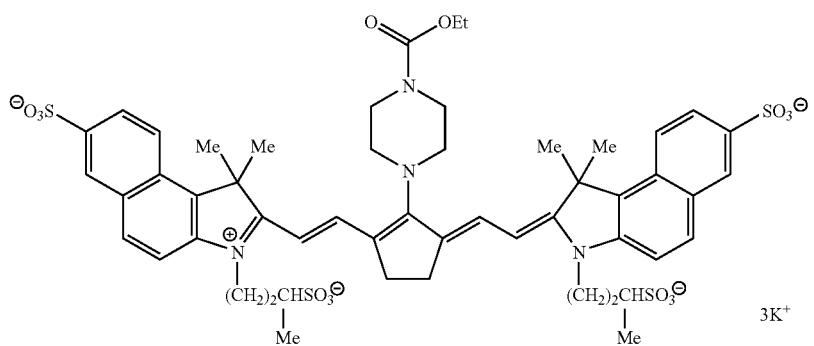

*-continued*

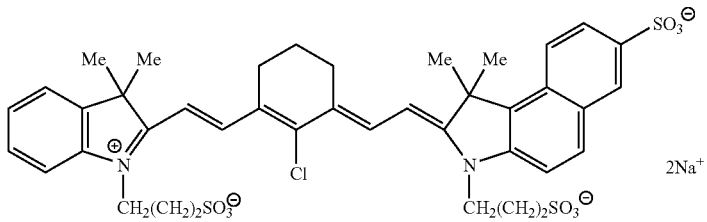

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

For example, representative useful IR-sensitive dyes of this type can be defined by the following Structure DYE-I:

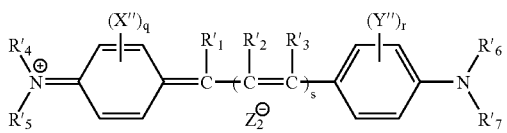

DYE-I wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 2, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.) that is incorporated herein by reference for this IR dye description and representative compounds.

In addition, other useful IR-sensitive dyes can also be represented by the following Structure DYE-II:

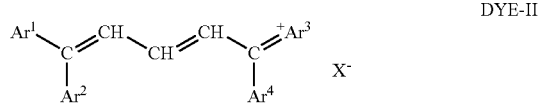

wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing counterions (borates), methylbenzenesulfonic acid, benzenesulfonic acid, methanesulfonic acid, p-hydroxybenzenesulfonic acid, p-chlorobenzenesulfonic acid, and halides.

Two representative IR dyes defined by Structure (DYE-II) are defined as D1 and D2 in WO 98/07574 (Patel et al.) that is incorporated by reference for these dyes and the synthetic method described therein.

Still other useful IR-sensitive dyes are represented by the following Structure (DYE-III):

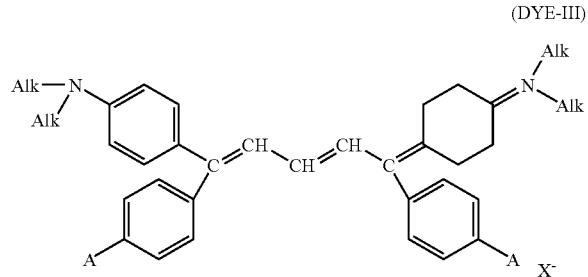

wherein "Alk" represents the same or different substituted or unsubstituted alkyl groups having 1 to 7 carbon atoms (such as substituted or unsubstituted methyl, ethyl, iso-propyl, t-butyl, n-hexyl, and benzyl), and "A" represents hydrogen or the same or different substituted or unsubstituted lower alkyl group having 1 to 3 carbon atoms (such as methyl, ethyl, n-propyl, and iso-propyl), or the same or different dialkylamino groups similar to those defined above for Structure (DYE-2), wherein such groups have the same or different alkyl groups. $X^-$ is a suitable counterion as defined above for Structure (DYE-II).

Some embodiments of this invention include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Representative useful dyes of this type are described as Dyes 2, 3-A, 3-B, 3-C, 12, and 22 described in EP 438,123A2 (noted above)

Useful infrared radiation absorbing dyes can be obtained from a number of commercial sources including Showa Denko (Japan) or they can be prepared using known starting materials and procedures. For example, IR dyes represented by Structure (DYE-I) can be prepared using the synthetic method illustrated in U.S. Pat. No. 6,623,908 (noted above) just before the examples, and IR dyes represented by Structures (DYE-II) and (DYE-III) can be prepared using the synthetic procedure described on page 10 (lines 11-14) of WO 98/07574 (noted above).

The infrared radiation absorbing compound (or sensitizer) can be present in the radiation-sensitive composition in an amount generally of at least 1% and up to and including 30% and typically at least 2 and up to and including 15%, based on total solids in the composition, that also corresponds to the total dry weight of the imageable layer. The particular amount needed for this purpose would be readily apparent to one skilled in the art, depending upon the specific compound used.

The radiation-sensitive composition can further comprises one or more nonionic phosphate acrylates, each of which has a molecular weight generally greater than 250 and typically at least 300 and up to and including 1000. By "nonionic" we mean that the phosphate acrylates not only are neutral in charge but they have no internal positive or negative charges. Thus, they are not internal salts or salts formed with an external cation or anion. Moreover, by "phosphate acrylate" we also meant to include "phosphate methacrylates" and other derivatives having substituents on the vinyl group in the acrylate moiety.

Each phosphate moiety may be connected to an acrylate moiety by an alkyleneoxy chain, that is a -(alkylene-O)$_m$— chain composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Representative nonionic phosphate acrylates can be represented by the following Structure (II):

$$P(=O)(OH)_n(R)_{3-n} \qquad (II)$$

wherein the R groups are independently the same or different groups represented by the following Structure (III):

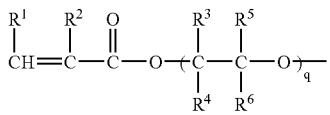

wherein $R^1$ and $R^2$ are independently hydrogen, or a halo group (such as fluoro, chloro, bromo, or iodo) or a substituted or unsubstituted alkyl group having 1 to 4 carbon atoms (such as methyl, chloromethyl, ethyl, isopropyl, n-butyl, and t-butyl). For example, $R^1$ and $R^2$ are independently hydrogen, methyl, or chloro, and typically, they are independently hydrogen or methyl.

$R^3$ through $R^6$ are independently hydrogen or a substituted or unsubstituted alkyl group having 1 to 5 carbon atoms (such as methyl, chloromethyl, hydroxymethyl, ethyl, iso-propyl, n-butyl, t-butyl, and n-pentyl). For example, $R^3$ through $R^6$ are independently hydrogen or substituted or unsubstituted methyl or ethyl groups, and typically, they are independently hydrogen or unsubstituted methyl groups.

Also, in Structure II, n is 1 or 2.

In Structure III, q is 1 to 10, or from 2 to 8, for example from 3 to 6.

Representative nonionic phosphate acrylates useful in this invention include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of caprolactone modified 2-hydroxyethyl methacrylate that is available as Kayamer PM-21 (Nippon Kayaku, Japan) that is also shown below, and an ethylene glycol methacrylate phosphate with 4-5 ethoxy groups that is available as Phosmer PE from Uni-Chemical Co., Ltd. (Japan) that is also shown below. Other useful nonionic phosphate acrylates are also shown below.

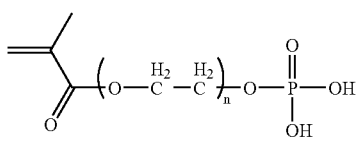
Phosmer PE (n = 4 or 5)

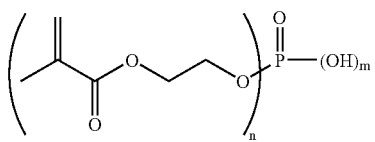
Kayamer PM-2 (m = 1 or 2, n = 3 - m)

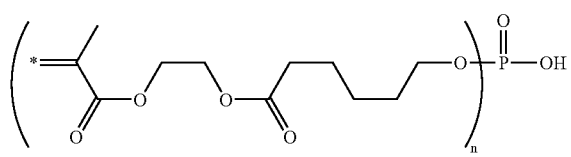
Kayamer PM-21 (n = 2)

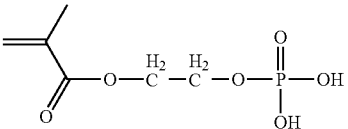
Phosmer M

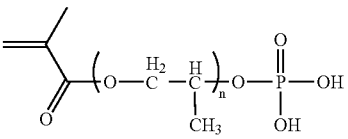
Phosmer PP (n = 5 or 6)

The nonionic phosphate acrylate can be present in the radiation-sensitive composition in an amount of at least 0.6 and up to and including 20% and typically at least 0.9 and up to and including 10%, by weight of the total solids. In the dry imageable layers of the imageable elements, the amount of nonionic phosphate acrylate is present in an amount of at least 8 mg/m$^2$ and up to and including 300 mg/m$^2$ and typically at least 10 and up to and including about 150 mg/m$^2$.

The nonionic phosphate acrylates useful in this invention can be prepared using known reaction conditions and starting materials and several of them are available from commercial sources.

The radiation-sensitive composition can also include a "primary additive" that is a poly(alkylene glycol) or an ether or ester thereof that has a molecular weight of at least 200 and up to and including 4000, particularly when an overcoat is omitted from the imageable element. This primary additive is present in an amount of at least 2 and up to and including 50 weight %, based on the total solids content of the composition, or the total dry weight of the imageable layer. Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly (vinyl pyrrolidone), poly(vinyl imidazole), or polyester in an amount of up to and including 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

As examples of useful antioxidants, which may act to extend shelf-life of the imageable element, are compounds that prevent oxidation of the polymeric binder(s) or infrared radiation absorbing dyes including but not limited to, phosphorus-containing antioxidants, sulfur-based antioxidants, amine-containing antioxidants, and phenol-containing antioxidants. Examples of such antioxidants and useful amounts are described in [0051]-[0060] of U.S. Patent Application Publication 2003/0031951 (Aburano), which antioxidant disclosure is incorporated herein by reference.

Imageable Elements

The imageable elements can be formed by suitable application of a radiation-sensitive composition as described above to a suitable hydrophilic substrate to form an imageable layer. This substrate can be treated or coated in various ways as described below prior to application of the radiation-sensitive composition to improve hydrophilicity. Typically, there is only a single imageable layer comprising the radiation-sensitive composition. If the substrate has been treated to provide an "interlayer" for improved adhesion or hydrophilicity, the applied radiation-sensitive composition is generally considered the "top" or outermost layer. These interlayers, however, are not considered "imageable layers".

The substrate generally has a hydrophilic surface, or at least a surface that is more hydrophilic than the applied radiation-sensitive composition on the imaging side for lithographic uses. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of a hydrophilic aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When sulfuric acid is used for anodization, higher oxide weight (at least 3 $g/m^2$) may provide longer press life.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied as the outermost layer.

Illustrative of such manufacturing methods is mixing the polymeric binder(s), radically polymerizable component, initiator composition, radiation absorbing compound, and any other components of the radiation-sensitive composition in a suitable organic solvent [such as methyl ethyl ketone (2-butanone), methanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$.

The element can also include what is conventionally known as an overcoat (such as an oxygen impermeable topcoat) applied to the imageable layer(s) as described in WO 99/06890 (Pappas et al.) out of suitable solvents. Such overcoat layers can comprise one or more water-soluble polymers such as poly(vinyl alcohol), poly(vinyl pyrrolidone), poly (ethyleneimine), and poly(vinyl imidazole) and generally have a dry coating weight of at least 0.1 and up to and including 4 $g/m^2$.

Layers can also be present under the imageable layer to enhance developability or to act as a thermal insulating layer. The underlying layer should be soluble or at least dispersible in the developer and typically have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed.

Useful water-impermeable sheet materials include but are not limited to, plastic films, metal foils, and waterproof papers that are usually in sheet-form and sufficiently flexible to conform closely to the shape of the imageable element (or stack thereof as noted below) including an irregularities in the surfaces. Typically, the water-impermeable sheet material is in close contact with the imageable element (or stack thereof). In addition, it is preferred that this material is sufficiently tight or is sealed, or both, so as to provide a sufficient barrier to the movement or transfer of moisture to or from the imageable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). The plastic films and metallic foils are most preferred. In addition, the edges of the water-impermeable sheet materials can be folded over the edges of the imageable elements and sealed with suitable sealing means such as sealing tape and adhesives.

The transfer of moisture from and to the imageable element is "substantially inhibited", meaning that over a 24-hour period, the imageable element neither loses nor gains no more than 0.01 g of water per m$^2$. The imageable element (or stack) can be enclosed or wrapped while under vacuum to remove most of the air and moisture. In addition to or instead of vacuum, the environment (for example, humidity) of the imageable element can be controlled (for example to a relative humidity of less than 20%), and a desiccant can be associated with the imageable element (or stack).

For example, the imageable element can be enclosed with the water-impermeable sheet material as part of a stack of imageable elements, which stack contains at least 5 imageable elements and more generally at least 100 or at least 500 imageable elements that are enclosed together. It may be desirable to use "dummy", "reject", or non-photosensitive elements at the top and bottom of the stack improve the wrapping. Alternatively, the imageable element can be enclosed in the form of a coil that can be cut into individual elements at a later time. Generally, such a coil has at least 1000 m$^2$ of imageable surface, and commonly at least 3000 m$^2$ of imageable surface.

Adjacent imageable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imageable element is exposed to a suitable source of imaging or exposing radiation such as UV, visible light, near-infrared, or infrared radiation, depending upon the radiation absorbing compound present in the radiation-sensitive composition, at a wavelength of from about 150 to about 1500 nm. In some embodiments, imaging is carried out using a source of UV or "violet" imaging or exposing radiation at from at least 150 nm and up to and including 475 nm and typically at least 200 nm and up to and including 450 nm. For example, imaging can be carried out using imaging or exposing radiation, such as from an infrared radiation-emitting laser at a wavelength of at least 700 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Imaging radiation in the UV to visible region of the spectrum, and particularly the UV region (for example at least 150 nm and up to and including 475 nm), can be carried out generally using energies of at least 0.01 mJ/cm$^2$ and up to and including 0.5 mJ/cm², and typically at least 0.02 and up to and including about 0.1 mJ/cm². It would be desirable, for example, to image the UV/visible radiation-sensitive imageable elements at a power density in the range of at least 0.5 and up to and including 50 kW/cm² and typically of at least 5 and up to and including 30 kW/cm². Such imaging could be carried out on-press, or the subsequent development could be carried out on-press.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

With or without a post-exposure baking step after imaging and before development, the imaged elements can be developed "off-press" using conventional processing and a conventional aqueous alkaline or organic solvent-based developer. Alternatively, the imaged elements can be developed, or imaged and developed, "on-press" as described in more detail below. In most embodiments, a post-exposure baking step is omitted.

For off-press development, the developer composition commonly includes one or more ingredients selected from the group consisting of surfactants, chelating agents (such as salts of ethylenediaminetetraacetic acid), organic solvents (such as benzyl alcohol), and alkaline components (such as inorganic metasilicates, organic metasilicates, hydroxides, bicarbonates, organic amines, and sodium triphosphates). The pH of the alkaline developer is typically at least 8 and up to and including 14. The imaged elements are generally developed using conventional processing conditions.

Developers commonly used for conventional negative-working elements may be used. Such developers are typically single-phase solutions containing organic solvents that are miscible or dispersible in water, surfactants, alkali agents, and other additives such as chelating agents, antifoamants, and algicides. The pH values of such developers are typically 12 or less and in the range of from about 7 to about 12. Useful organic solvents include the reaction products of phenol with ethylene oxide and propylene oxide [such as ethylene glycol phenyl ether (phenoxyethanol)], benzyl alcohol, esters of mono- di-, or triethylene glycol and of mono-, di-, or tripropylene glycol with acids having 6 or less carbon atoms, and ethers of mono-, di-, or triethylene glycol, diethylene glycol, and of mono-, di-, or tripropylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative developers used for conventional negative-working elements include ND-1 Developer, Developer 980, SP 200 Developer, "2-in-1" Developer, ProNeg D-501 Developer, 955 Developer, and 956 Developer (available from Kodak Polychrome Graphics a subsidiary of Eastman Kodak Company).

Developers commonly used for developing conventional positive-working elements may also be used. Such developers typically contain alkali agents (such as alkali metal silicate or metasilicates, alkali metal hydroxides, alkali metal triphosphates, and alkali metal carbonates), and optional additives such as surfactants, anticorrosion agents, chelating agents, antifoamants, and coating protection agents. Such developers generally have a pH of at least 11 and typically of at least 13. Useful developers of this type include 3000 Developer, 9000 Developer, GOLDSTAR Developer, GREENSTAR Developer, ThermalPro Developer, PROTHERM Developer, MX1813 Developer, TCD-300 Developer, and MX1710 Developer (all available from Kodak Polychrome Graphics, a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following off-press development, the imaged element can be rinsed with water and dried in a suitable fashion. The dried element can also be treated with a conventional gumming solution (such as gum arabic). In addition, a postbake operation can be carried out, with or without a blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention are designed for development "on-press". This type of development avoids the use of the developing solutions described above. The imaged element is directed mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, anti-foaming agents, and sequestering agents. A representative example of a fountain solution is Varn Litho Etch 142W+Varn PAR (alcohol sub) (available from Varn International, Addison, Ill.).

The following examples are provided to illustrate the practice of the invention but are by no means intended to limit the invention in any manner.

EXAMPLES

The components and materials used in the examples and analytical methods used in evaluation were as follows:

AIBN represents azobisisobutyronitrile or 2,2'-azobis(2-methylpropionitrile), for example Vazo-64 that is available from DuPont (Wilmington, Del.).

Airvol® 203 is a poly(vinyl alcohol) that was obtained from Air Products and Chemicals (Allentown, Pa.).

Byk® 307 is a polyethoxylated dimethyl polysiloxane copolymer that was obtained from Byk Chemie (Wallingford, Conn.) in a 25 weight % xylene/methoxypropyl acetate solution.

Graft Copolymer A is a 24 wt. % dispersion in an 80/20 mixture of n-propanol/water of Copolymer 9 described in paragraph [0139] of U.S. Patent Application Publication 2004-0260050 that was derived from poly(ethylene glycol) methyl ether methacrylate (average $M_n$ of 2080), styrene, and acrylonitrile at a weight ratio of 10:9:81 of the three monomers.

Initiator A is bis(4-t-butylphenyl) iodonium tetraphenylborate.

IRT is an IR Dye that was obtained from Showa Denko (Japan) and has the following structure:

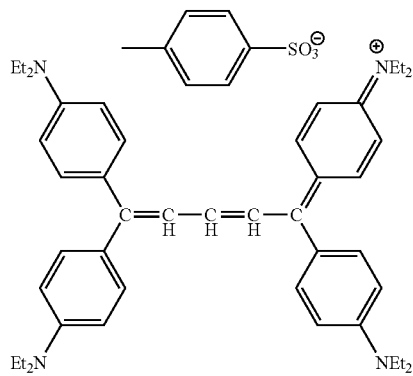

MEK represents methyl ethyl ketone.

Oligomer A represents a urethane acrylate was prepared by reacting Desmodur® N100 with hydroxyethyl acrylate and pentaerythritol triacrylate.

PEGDA represents poly(ethylene glycol) diacrylate (Mw=700) that was obtained from Aldrich Chemical Company (Milwaukee, Wis.).

PGME represents 1-methoxy-2-propanol and it is also known as Dowanol PM.

Phosmer PE is an ethylene glycol methacrylate phosphate with 4-5 ethoxy groups that was obtained from Uni-Chemical Co. Ltd. (Japan).

Pigment A is a 22.5% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Polymer 1 is an addition copolymer derived from allyl methacrylate (80 wt %) and methyl methacrylate (20 wt %) in diethylketone.

Polymer 2 is an addition copolymer derived from styrene (43.3 mol %), methyl methacrylate (45 mol %), and acrylic acid (11.7 mol %).

Sartomer SR-399 is dipentaerythritol pentaacrylate that was obtained from Sartomer Company, Inc.

955 Developer is an organic solvent-containing alkaline developer that is available from Eastman Kodak Company (Norwalk, Conn.).

Synthetic Example 1

Preparation of Polymer A

Dimethylacetamide (100 g), methyl vinyl ketone (4.5 g), styrene (3.8 g), vinyl carbazole (2.5 g), acrylic acid (3.0 g), acrylonitrile (11 g), and AIBN (0.25, Vazo-64) were charged into a 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture of dimethylacetamide (135.66 g), methyl vinyl ketone (13.0 g), styrene (11.2 g), vinyl carbazole (7.5 g), acrylic acid (9.5 g), acrylonitrile (34.0 g), and AIBN (0.5 g, Vazo-64) were added over two hours at 80° C. Reaction was continued another thirteen hours during which another 0.75 g of AIBN was added in increments. Polymer conversion was >97% based on the determination of percent of non-volatiles. The resulting Polymer A was precipitated in powder form in 5000 g of pre-mix deionized water/ice using a Charles & Ross & Son Company Dispersator (Model # ME 100LC) at 7000 RPM then the polymer was filtered. The powder was dried at room temperature for 24 hours and 43.3° C. (110° F.) for two days. The yield was >93%. The $T_g$ of Polymer A is 106.7° C. as determined by DSC.

Synthetic Example 2

Preparation of Polymer B

Dimethylacetamide (100 g), methyl vinyl ketone (4.5 g), cyclohexyl acrylate (3.8 g), vinyl carbazole (2.5 g), acrylic acid (2.5 g), acrylonitrile (12.0 g), and AIBN (0.25 g, Vazo-64) were charged into a 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture of dimethylacetamide (135.66 g), methyl vinyl ketone (13.0 g), cyclohexyl acrylate (11.2 g), vinyl carbazole (7.5 g), acrylic acid (8.0 g), acrylonitrile (35 g), and AIBN (0.5 g, Vazo-64) were added over two hours at 80° C. Reaction was continued another sixteen hours during which another 0.75 g of AIBN was added in increments. The polymer conversion was >98% based on determination of percent of non-volatiles. The resulting Polymer B was precipitated in powder form in 5000 g of pre-mix deionized water/ice using a Charles & Ross & Son Company Dispersator (Model # ME 100LC) at 7000 RPM and then the polymer was filtered. The powder was dried at room temperature for 24 hours and 43.3° C. (110° F.) for two days. The yield was >96%. The $T_g$ of Polymer B is 94.4° C. as determined by DSC.

Synthetic Example 3

Preparation of Polymer C

Dimethylacetamide (100.0 g), methyl vinyl ketone (4.5 g), cyclohexyl methacrylate (3.8 g), vinyl carbazole (2.5 g), acrylic acid (2.5 g), acrylonitrile (12 g), and AIBN (0.25 g, Vazo-64) were charged into a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then a pre-mixture of dimethylacetamide (135.66 g), methyl vinyl ketone (13.0 g), cyclohexyl methacrylate (11.2 g), vinyl carbazole (7.5 g), acrylic acid (8.0 g), acrylonitrile (35 g), and AIBN (0.5 g, Vazo-64) were added over two hours at 80° C. Reaction was continued another sixteen hours and during processing, 0.75 g of AIBN was added in increments. The polymer conversion was >98% based on a determination of percent of non-volatiles. The resin solution was precipitated in powder form in 5000 g of pre-mix DI water/ice using Charles & Ross & Son Company Dispersator (Model # ME 100LC) at 7000 RPM and the material was then filtered. The resulting powder was dried at room temperature for 24 hrs and 110° F. (43.3° C.) for two days. The yield was >96%. The $T_g$ of Polymer C is 98.4° C. as determined by DSC.

Synthetic Example 4

Preparation of Polymer 3

Vinyl carbazole (4.0 g, from Polymer Dajac) and DMAC (50 g) were placed in a 500-ml 3-necked flask, equipped with magnetic stirring, condenser, temperature controller, and $N_2$ inlet. The mixture was heated to 75° C. A solution containing AIBN (0.6 g), methyl methacrylate (12.0 g), methacrylic acid (6.0 g), acrylonitrile (18.0 g), and DMAC (80 g) was dropped into the flask through a additional funnel (first 30 g quickly and then 90 g dripped in slowly) during a period of 2 hours. After addition was completed, the reaction continued under $N_2$ at 75° C. for another 2 hours. AIBN (0.2 g) was added and the reaction was continued overnight, and 24% solid was recorded (theoretical yield is 23.5%). After cooling to room temperature, the mixture was dropped slowly into 3000 ml of ice/water while stirring. The precipitate of Polymer 3 was filtered and dried at ambient temperature overnight, and then at 50° C. for 3 hours (38 g solids).

Invention Examples 1-3 and Comparative Examples 1-3

Five imageable layer coating formulations containing the components listed in TABLE I below were prepared in a PGME/MEK/water (60/35/5 wt. %) solvent mixture with a concentration of 5.77 wt. % solids.

TABLE I

| Component | Percentage by Weight |
| --- | --- |
| Oligomer A | 24.0 |
| Sartomer SR-399 | 23.0 |
| Polymer* | 30.5 |
| Phosmer PE | 1.5 |
| Initiator A | 7.0 |
| PEGDA | 7.0 |
| IRT IR Dye | 3.0 |
| Pigment A | 3.0 |
| Byk ® 307 | 1.0 |

*Invention Example 1 contained Polymer A, Invention Example 2 contained Polymer B, Invention Example 3 contained Polymer C, Comparative Example 1 contained Polymer 1, Comparative Example 2 contained Polymer 2, and Comparative Example 3 contained Polymer 3.

Each of the formulations from TABLE I was coated with a wire-wound rod onto an electrically-grained and sulfuric acid anodized aluminum substrate that had been post-treated with a poly(vinyl phosphonic acid) solution, providing an imageable layer dry coating weight of about 1.2 g/m² when dried at about 100° C. for about 1 minute in a Ranar conveyor oven.

The resulting negative-working imageable elements (printing plate precursors) were exposed to 830 nm IR laser at 2.5 watts power and varying drum speed (250-100 RPM) on a CREO Trendsetter® 3244x image setter (available from Eastman Kodak Company) and were developed in an NE 34 processor (Eastman Kodak Company) that was charged with 955 Developer at 23° C. (73° F.). Graphical plots of the optical density of imaged areas as a function of exposure energy (mJ/cm²) for the six resulting printing plates are shown in FIG. 1 wherein Plot I-1 is for Invention Example 1, Plot I-2 is for Invention Example 2, Plot I-3 is for Invention Example 3. Plot C-1 is for Comparative Example 1, Plot C-2 is for Comparative Example 2, and Plot C-3 is for Comparative Example 3. It can be seen from these data that the printing plates from Invention Examples 1-3 gave the highest optical density in imaged areas while requiring less exposure energy.

Invention Example 4

An imageable layer coating formulation was prepared by dissolving Polymer A (0.58 g), Oligomer A (0.98 g), SR-399 (1.72 g), Initiator A (0.22 g), IRT IR Dye (0.094 g), Pigment A (0.42 g), Graft Polymer A (2.41 g), Phosmer PE (0.06 g), and 10% Byk® 307 (0.31 g) in PGME (25.7 g), water (2.3 g), and MEK (14.6 g). An electrically-grained and sulfuric acid-anodized aluminum substrate that had been post-treated with a poly(vinyl phosphonic acid) (PVPA) was coated with the imageable layer formulation on a rotating drum to provide a coating weight of about 1.3 g/m² when dried at 76.7° C. (170° F.) for about 2 minutes.

The resulting imageable element (printing plate precursor) was exposed to an 830 nm IR laser at 120 mJ/cm² on a CREO Trendsetter® 3244x image setter, and then developed using an NE 34 processor charged with 955 Developer at 23° C. (73° F.). The resulting lithographic printing plate was then mounted on a Miehle sheet-fed press using a wear ink containing 1.5% calcium carbonate and used to produce at least 20,000 good impressions.

Invention Example 5

A coating solution was prepared by dissolving Polymer B (0.58 g), Oligomer A (0.98 g), SR-399 (1.72 g), Initiator A (0.22 g), IRT IR Dye (0.094 g), Pigment A (0.42 g), Graft Polymer A (2.41 g), Phosmer PE (0.06 g), and 10% Byk® 307 (0.31 g) in PGME (25.7 g), water (2.3 g), and MEK (14.6 g). An electrically-grained and sulfuric acid-anodized aluminum substrate that had been post-treated with a poly(vinyl phosphonic acid) (PVPA) was coated with above imageable layer formulation on a rotating drum to provide a coating weight of about 1.3 g/m² when dried at 76.6° C. (170° F.) for about 2 minutes.

The resulting imageable element (printing plate precursor) was exposed to an 830 nm IR laser at 120 mJ/cm² on a CREO Trendsetter® 3244x image setter, and then developed using an NE 34 processor charged with 955 Developer at 23° C. (73° F.). The resulting lithographic printing plate was then mounted on a Miehle sheet-fed press using a wear ink containing 1.5% calcium carbonate and used to produce at least 20,000 good impressions.

Invention Example 6

This example describes the preparation and press evaluation of two-layer imageable elements using Polymer A.

A coating solution was prepared by dissolving 1.76 g of Polymer A, 1.38 g of dipentaerythritol hexaacrylate, 3.32 g of SR-399, 0.40 g of Initiator A, 0.17 g of IRT IR Dye, 0.69 g of Pigment A, 0.40 g of polyethylene glycol diacrylate (MW=700), 0.087 g of Phosmer PE and 0.58 g of 10% Byk® 307 in 55.5 g of PGME, 4.7 g water, and 30.2 g of MEK. A electrically-grained and sulfuric acid anodized aluminum substrate that had been post-treated with a poly(vinyl phosphonic acid) (PVPA) was coated with the imageable layer solution on a rotating drum and resulted in a dry coating weight of about 1.2 g/m² and dried at 170° F. (76.7° C.) for about 2 minutes.

The resulting imageable layer was overcoated with a solution containing 16.3 g of 9.7% Airvol® 203 poly(vinyl alcohol) in water, 1.4 g of 20% poly(vinyl imidazole) in water, 1.2 g of 2-propanol, and 11.1 g of water. The overcoat solution using a wire-wound rod and dried for approximately 40 seconds residence time in a Ranar conveyor oven set at about 100° C., to provide a dry coating weight of about 0.4 g/m².

The resulting double layer imageable element was exposed to 830 nm IR laser at 120 mJ/cm² on a CREO Trendsetter 3244x image setter (Kodak), and were developed in an NE 34 processor (Kodak) charged with 955 Developer at 73° F. (23° C.). The imaged element was then mounted on a Miehle sheet-fed press using a wear ink containing 1.5% calcium carbonate and used to produce at least 13,000 good impressions.

The invention has been described in detail with particular reference to certain preferred embodiments thereof, but it will be understood that variations and modifications can be effected within the spirit and scope of the invention.

The invention claimed is:

1. A lithographic printing plate precursor comprising an aluminum-containing substrate having thereon an imageable layer comprising:
   a radically polymerizable component,
   an initiator composition capable of generating free radicals sufficient to initiate polymerization of free radically polymerizable groups upon exposure to imaging radiation,
   a radiation absorbing compound, and
   a polymeric binder that has an acid value of from about 20 to about 400 mg KOH/g and an all carbon backbone to which are attached the same or different pendant groups with the exception of pendant groups having ethylenically unsaturated free radically reactive groups, and that is represented by the following Structure (I):

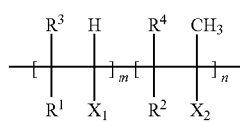

wherein m is at least 85 mol % and the sum of m and n is 100 mol %, $R^1$ through $R^4$ are independently hydrogen or methyl, $X_1$ is one or more acetyl, phenyl other than styryl, N-carbazole, cyano, carboxy ester, or carboxy amide pendant groups, and $X_2$ is one or more carboxy ester or carboxy amide pendant groups provided that when either $R^2$ or $R^4$ is hydrogen, both are hydrogen, and
said initiator composition includes one or more diaryliodonium borate compounds, each of which is represented by the following Structure (IB):

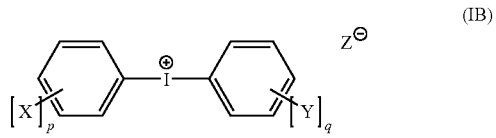

wherein X and Y are independently halo, alkyl, alkyloxy, aryl, or cycloalkyl groups, or adjacent X or Y groups can be combined to form a fused carbocyclic or heterocyclic ring with the respective phenyl groups, p and q are independently 0 or integers of 1 to 5, provided that either p or q is at least 1, and $Z^-$ is an organic anion represented by the following Structure (IB$_Z$):

wherein $R_1$, $R_2$, $R_3$, and $R_4$ are independently aryl groups.

2. The element of claim 1 wherein said m is at least 89 and up to 100 mol %.

3. The element of claim 1 wherein said tertiary carbon atoms are part of recurring units derived from two or more ethylenically unsaturated polymerizable monomers selected from vinyl carbazole, styrene and derivatives thereof other than styryl, acrylic acid, acrylates, acrylamides, acrylonitrile, and methyl vinyl ketone, and said polymeric binder further comprises recurring units derived from one or more ethylenically unsaturated polymerizable monomers selected from methacrylic acid, methacrylates, methacrylamides, and α-methylstyrene.

4. The element of claim 1 wherein said radiation absorbing compound comprises an infrared radiation sensitive compound having a $\lambda_{max}$ of from about 700 to about 1400 nm, or comprises a sensitizer having a $\lambda_{max}$ of from about 150 to about 475 nm.

5. The element of claim 1 wherein said substrate is an aluminum-containing substrate having a hydrophilic surface upon which said imageable layer is disposed, and optionally including an overcoat disposed over said imageable layer.

6. A method of making a lithographic printing plate comprising:
   A) imagewise exposing the lithographic printing plate precursor of claim 1 using imaging radiation to produce exposed and non-exposed regions, and
   B) without a post-exposure baking step, developing said imagewise exposed printing plate precursor off-press using an aqueous developer having a pH of 12 or less to remove only said non-exposed regions, and
   C) optionally heating or floodwise UV-exposing said developed lithographic printing plate precursor.

7. The method of claim 6 wherein step A is carried out using an infrared radiation-emitting laser.

8. The method of claim 6 that provides a lithographic printing plate optionally including an overcoat in said exposed regions.

9. The element of claim 1 wherein the sum of the carbon atoms in the X and Y substituents is at least 6.

10. A lithographic printing plate precursor comprising an aluminum-containing substrate having thereon an imageable layer comprising:

a radically polymerizable component, an initiator composition capable of generating free radicals sufficient to initiate polymerization of free radically polymerizable groups upon exposure to imaging radiation, an infrared radiation absorbing compound, a polymeric binder that has an acid value of from about 20 to about 400 mg KOH/g and an all carbon backbone wherein at least 40 mol % of the carbon atoms forming said all carbon backbone are tertiary carbon atoms to which are attached the same or different pendant groups with the exception of pendant groups having ethylenically unsaturated free radically reactive groups, and a phosphate acrylate wherein the polymeric binder is represented by the following structure (I):

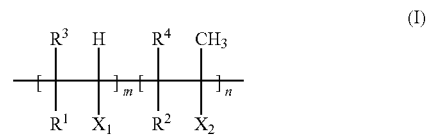

Wherein m is at least 85 mol % and the sum of m and n is 100 mol %, $R^1$ through $R^4$ are independently hydrogen or methyl, $X_1$ is one or more acetyl, phenyl other than styryl, N-carbazole, cyano, carboxy ester, or carboxy amide pendant groups, and $X_2$ is one or more carboxy ester or carboxy amide pendant groups.

* * * * *